(12) United States Patent
Ogawa

(10) Patent No.: US 9,831,285 B2
(45) Date of Patent: Nov. 28, 2017

(54) PHOTOELECTRIC CONVERSION APPARATUS AND METHOD OF MANUFACTURING THE SAME

(71) Applicant: CANON KABUSHIKI KAISHA, Tokyo (JP)

(72) Inventor: Toshiyuki Ogawa, Abiko (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/370,842

(22) Filed: Dec. 6, 2016

(65) Prior Publication Data
US 2017/0162623 A1 Jun. 8, 2017

(30) Foreign Application Priority Data
Dec. 8, 2015 (JP) ................. 2015-239716

(51) Int. Cl.
| | |
|---|---|
| *H01L 21/00* | (2006.01) |
| *H01L 29/788* | (2006.01) |
| *H01L 31/0232* | (2014.01) |
| *H01L 27/146* | (2006.01) |

(52) U.S. Cl.
CPC .... *H01L 27/14689* (2013.01); *H01L 27/1463* (2013.01); *H01L 27/14603* (2013.01); *H01L 27/14614* (2013.01); *H01L 27/14643* (2013.01)

(58) Field of Classification Search
CPC ........ H01L 27/14689; H01L 27/14614; H01L 27/14603

USPC .................... 257/320, 432; 438/70
See application file for complete search history.

(56) References Cited

U.S. PATENT DOCUMENTS

| | | | |
|---|---|---|---|
| 2007/0057147 A1 | 3/2007 | Kim | |
| 2009/0121119 A1* | 5/2009 | Nishi | G01J 1/44 |
| | | | 250/214 LS |
| 2011/0204467 A1 | 8/2011 | Ohchi et al. | |
| 2012/0033119 A1 | 2/2012 | Shinohara | |
| 2013/0009039 A1 | 1/2013 | Sato et al. | |
| 2015/0041942 A1 | 2/2015 | Ebiko et al. | |
| 2015/0243700 A1 | 8/2015 | Morooka | |
| 2015/0255501 A1 | 9/2015 | Murano | |
| 2017/0148833 A1* | 5/2017 | Kido | H01L 27/14614 |
| 2017/0187977 A1* | 6/2017 | Iwabuchi | H04N 5/378 |

FOREIGN PATENT DOCUMENTS

| | | |
|---|---|---|
| JP | 2006287117 A | 10/2006 |
| JP | 2010251388 A | 11/2010 |
| JP | 2015095484 A | 5/2015 |

\* cited by examiner

*Primary Examiner* — David S Blum
(74) *Attorney, Agent, or Firm* — Canon U.S.A. Inc., IP Division

(57) ABSTRACT

A method of manufacturing a photoelectric conversion apparatus includes forming a first semiconductor region of a first conductivity type in a trench provided in a semiconductor substrate, forming an insulating member on the semiconductor substrate, and forming a second semiconductor region of a second conductivity type that forms a photoelectric conversion portion. The first semiconductor region is present between the second semiconductor region and the insulating member in a direction perpendicular to a depth direction of the semiconductor substrate.

20 Claims, 8 Drawing Sheets

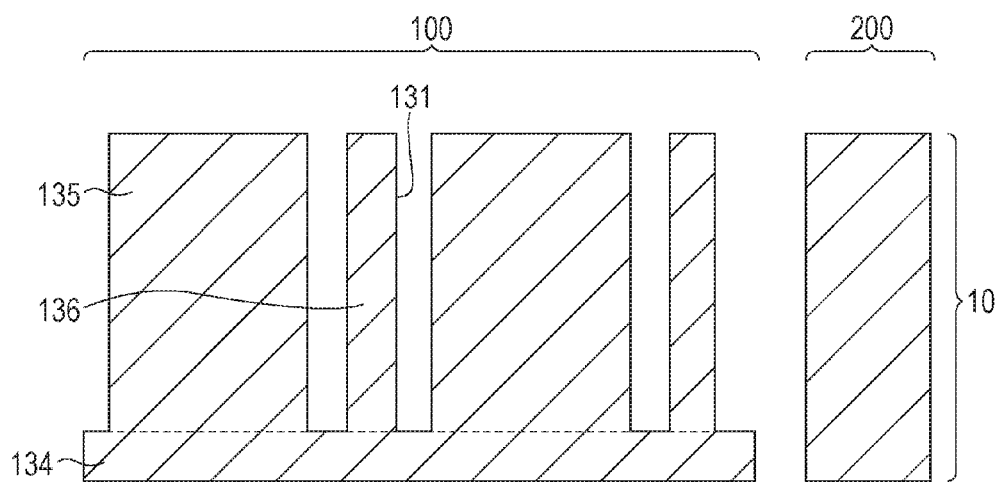
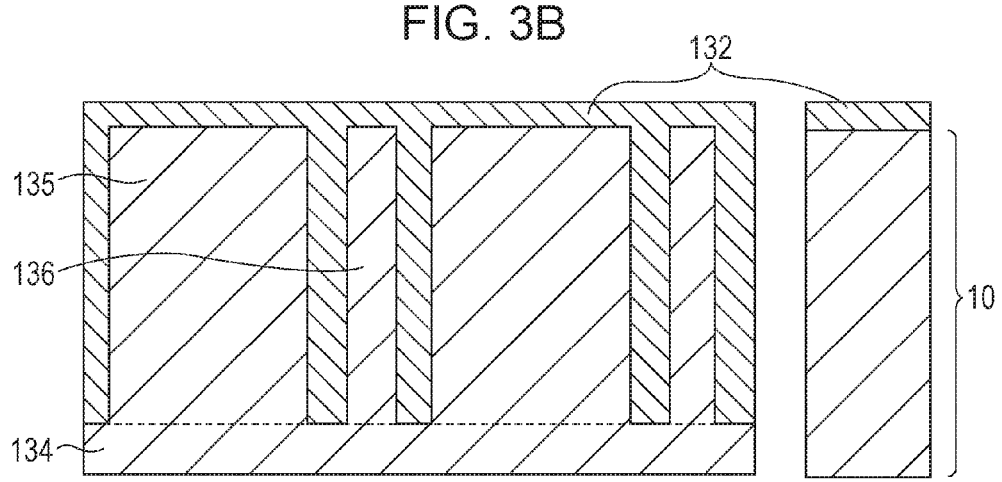
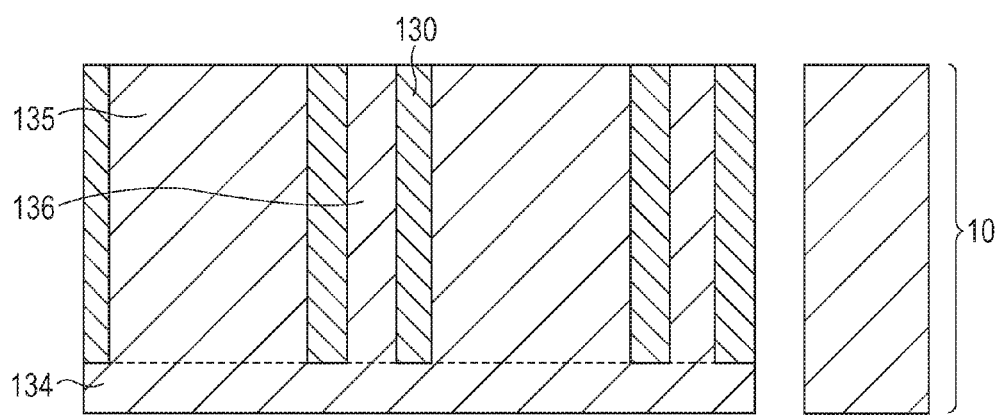

PHOTOELECTRIC CONVERSION APPARATUS AND METHOD OF MANUFACTURING THE SAME

BACKGROUND OF THE INVENTION

Field of the Invention

The present technique relates to a photoelectric conversion apparatus.

Description of the Related Art

In photoelectric conversion apparatuses such as complementary-metal-oxide-semiconductor (CMOS) image sensors, if electric charge generated at an interface between an element-isolation insulating member and a semiconductor region is taken into a photoelectric conversion portion, noise such as dark currents and white scratches increases, leading to a reduction in the signal-to-noise (S/N) ratio. For reduction of such noise, a semiconductor region whose conductivity type is opposite to that of the signal charge is provided around the element-isolation insulating member.

According to Japanese Patent Laid-Open No. 2015-95484, a p-type guard ring GR is provided on one side of a photodiode PD1 (a trench isolation TI). Furthermore, an epitaxial layer PE3 provided exactly below the trench isolation TI in such a manner as to fill a deep trench DT forms a pixel isolation region SPT.

In the technique disclosed by Japanese Patent Laid-Open No. 2015-95484, however, the isolation structure is not thoroughly examined, and the degree of improvement in the S/N ratio obtained in this technique is still limited.

SUMMARY OF THE INVENTION

The present technique provides a photoelectric conversion apparatus exhibiting a favorable S/N ratio and a method of manufacturing the same.

According to an aspect of the present disclosure, there is provided a method of manufacturing a photoelectric conversion apparatus including forming a first semiconductor region of a first conductivity type in a trench provided in a semiconductor substrate, forming an insulating member on the semiconductor substrate, forming a second semiconductor region of a second conductivity type that forms a photoelectric conversion portion, and forming a gate electrode of a transistor on the semiconductor substrate. The first semiconductor region is present between the second semiconductor region and the insulating member in a direction perpendicular to a depth direction of the semiconductor substrate. A first part of the gate electrode is positioned above a channel region of the transistor. A second part of the gate electrode that is different from the first part is positioned above the insulating member.

Further features will become apparent from the following description of exemplary embodiments with reference to the attached drawings.

BRIEF DESCRIPTION OF THE DRAWINGS

FIG. 3A to 3C illustrate an exemplary method of manufacturing the photoelectric conversion apparatus in sectional view.

DESCRIPTION OF THE EMBODIMENTS

Figure 1A:
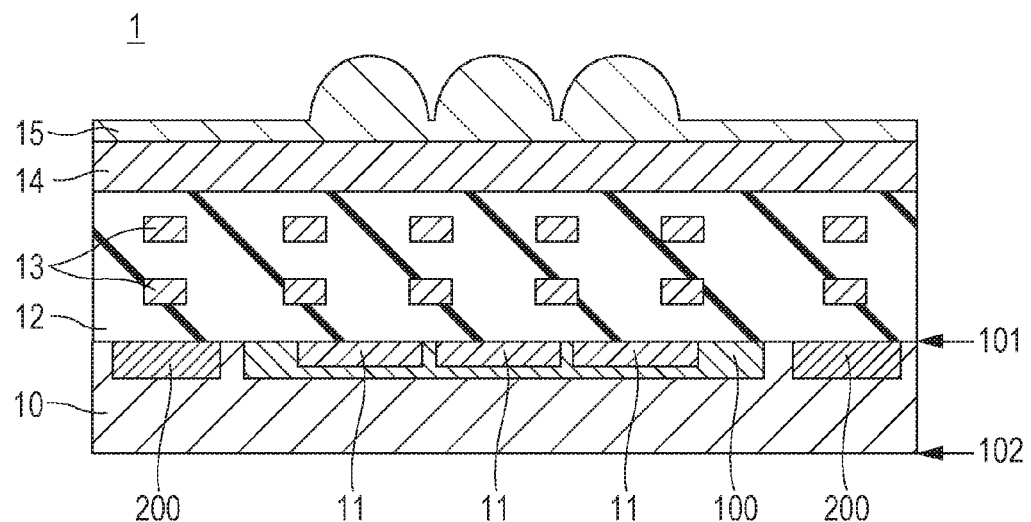
FIG. 1A is a schematic sectional view of an exemplary photoelectric conversion apparatus.

Embodiments of the present disclosure will now be described with reference to the attached drawings. In the following description and in each of the drawings, elements that are common to a plurality of drawings are denoted by the same reference numerals, respectively. Hence, such elements are described with cross-reference with several drawings, and description of those elements is omitted, if not necessary.

Figure 1B:
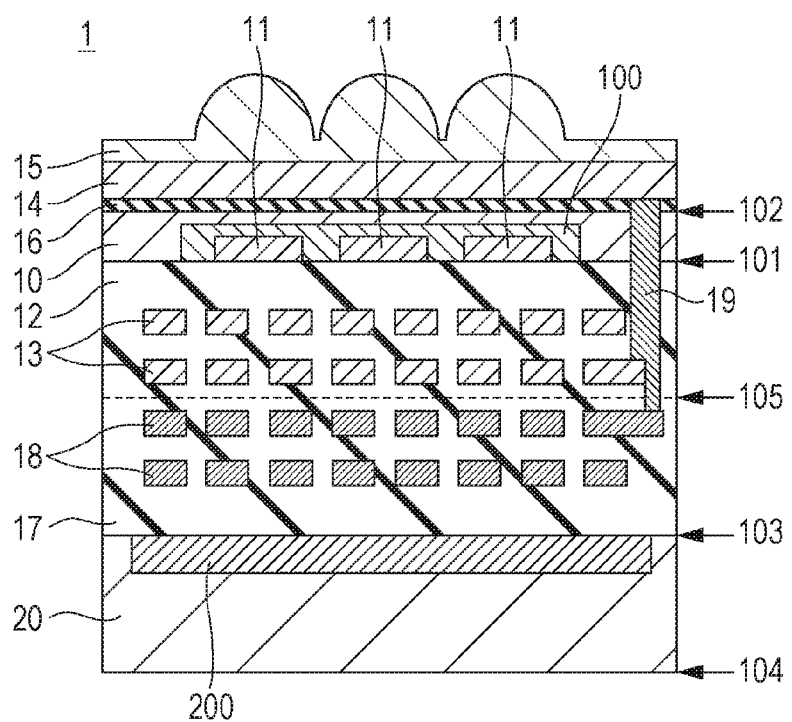
FIG. 1B is a schematic sectional view of another exemplary photoelectric conversion apparatus.

FIG. 1A illustrates a front-illuminated imaging apparatus as an example of a photoelectric conversion apparatus 1. FIG. 1B illustrates a back-illuminated imaging apparatus as another example of the photoelectric conversion apparatus 1.

The photoelectric conversion apparatus 1 includes a pixel circuit region 100 and a peripheral circuit region 200. The pixel circuit region 100 is provided in a semiconductor substrate 10 having a front surface 101 and a back surface 102. The pixel circuit region 100 includes an array of pixel circuits 11. The semiconductor substrate 10 carries, on the front surface 101 thereof, an interlayer insulating film 12, in which a stack of a plurality of wiring layers 13 are provided. In the example illustrated in FIG. 1A, a color filter array 14 and a microlens array 15 are provided on the side of the front surface 101 of the semiconductor substrate 10. In the example illustrated in FIG. 1B, the color filter array 14 and the microlens array 15 are provided on the side of the back surface 102 of the semiconductor substrate 10 with an insulating film 16 interposed between the semiconductor substrate 10 and the color filter array 14. In the example illustrated in FIG. 1A, the peripheral circuit region 200 is provided in the semiconductor substrate 10. In the example illustrated in FIG. 1B, the peripheral circuit region 200 is provided in a semiconductor substrate 20 having a front surface 103 and a back surface 104. The semiconductor substrate 20 carries, on the front surface 103 thereof, an interlayer insulating film 17, in which a stack of a plurality of wiring layers 18 are provided. The semiconductor substrate 10 and the semiconductor substrate 20 are bonded to each other at a joint surface 105. The wiring layers 13 and the wiring layers 18 are electrically connected to each other with a connecting member 19. If the semiconductor substrate 20 is employed as a supporting substrate, the peripheral circuit region 200 may be provided in the semiconductor substrate 10.

The photoelectric conversion apparatus 1 may further include a package that houses the semiconductor substrate 10. The photoelectric conversion apparatus 1 can form a part of an imaging system. Such an imaging system is an information terminal including a camera or having an image shooting function. The imaging system can include at least one of a signal processing unit configured to process a signal obtained by the photoelectric conversion apparatus 1, a storage unit configured to store the signal obtained by the photoelectric conversion apparatus 1, and a display unit configured to display information obtained by the photoelectric conversion apparatus 1.

Figure 2A:
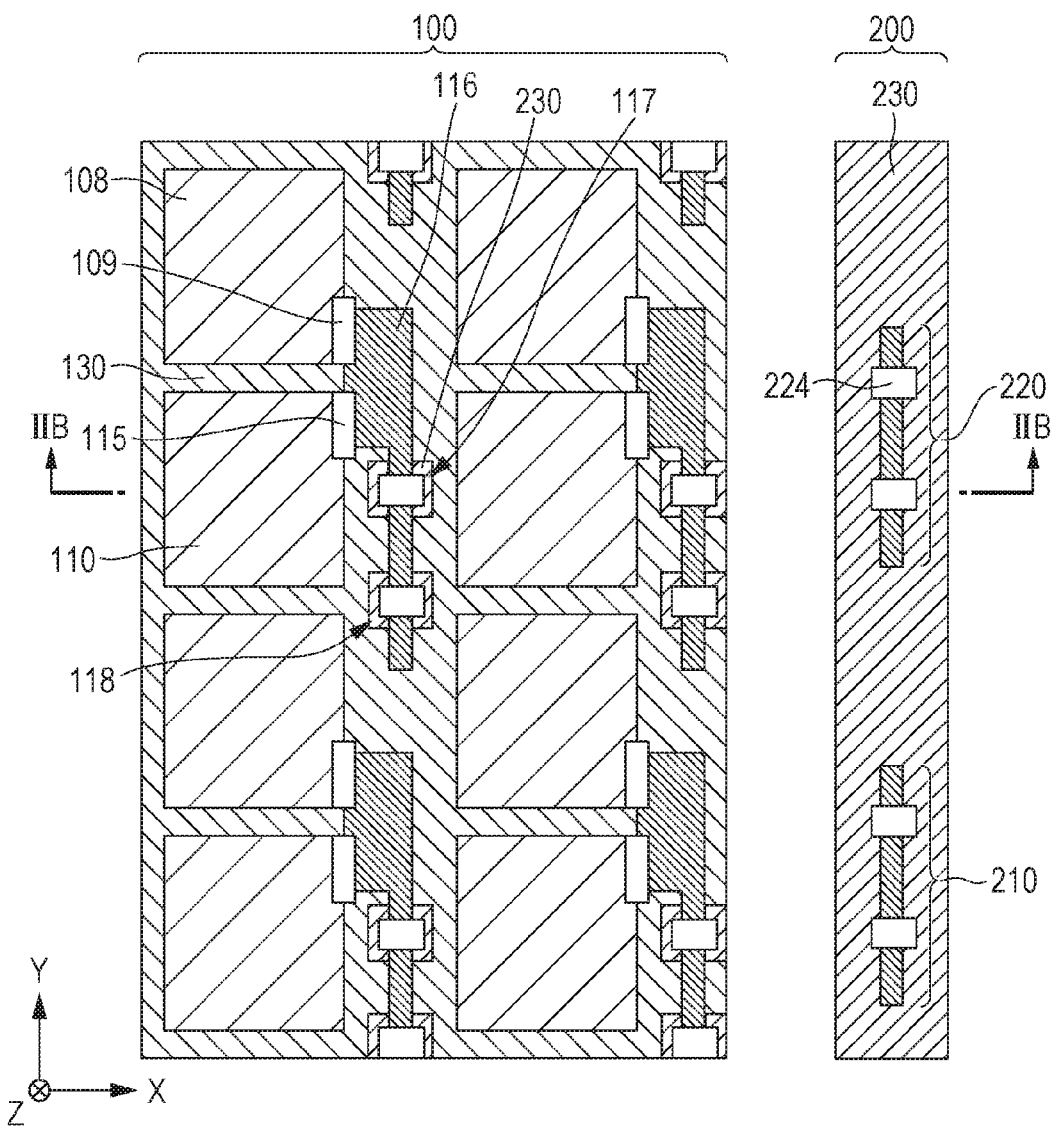
FIG. 2A is a schematic plan view of a semiconductor substrate included in an exemplary photoelectric conversion apparatus.
Figure 2B:
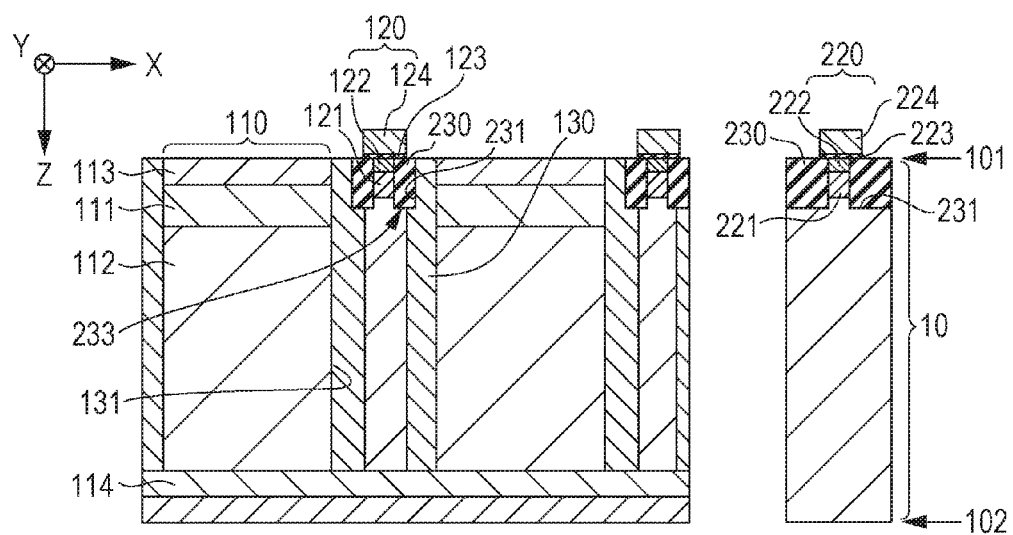
FIG. 2B is a schematic sectional view of the semiconductor substrate.

FIG. 2A is a schematic plan view of the semiconductor substrate 10 that is taken at an X-Y plane on the front side. FIG. 2B is a schematic sectional view of the semiconductor substrate 10 at an X-Z plane extending along line IIB-IIB illustrated in FIG. 2A. The X direction and the Y direction are each a direction (an in-plane direction) perpendicular to the depth direction (thickness direction) of the semiconductor substrate 10. FIG. 2A illustrates a case where the pixel circuit region 100 and the peripheral circuit region 200 are provided in the semiconductor substrate 10.

FIG. 2A illustrates four pixel circuits 11 providing eight pixels arranged in a matrix of 4 by 2. One pixel circuit 11 provides two pixels. The pixel circuits 11 each include photoelectric conversion portions 110 and 108 as photodiodes, transfer gates 115 and 109, a floating diffusion 116, a reset transistor 117, and an amplifier transistor 118. The drain of the reset transistor 117 and the gate of the amplifier transistor 118 are each connected to the floating diffusion 116. Electric charge generated in the photoelectric conversion portion 108 is transferred to the floating diffusion 116 through the transfer gate 109. Electric charge generated in the photoelectric conversion portion 110 is transferred to the floating diffusion 116 through the transfer gate 115. The amplifier transistor 118 forms a source-follower circuit. The reset transistor 117 and the amplifier transistor 118 are generally referred to as pixel transistors 120. The pixel circuit 11 according to the present embodiment has a configuration in which one amplifier transistor 118 is shared between the photoelectric conversion portions 110 and 108. Alternatively, the amplifier transistor 118 may be provided for each of the pixels.

In the following description, signal charge is regarded as electrons. Alternatively, signal charge may be regarded as positive holes. In the latter case, the conductivity type mentioned in the following description only needs to be reversed, that is, the n type is changed to the p type, and the p type is changed to the n type.

As illustrated in FIG. 2B, the photoelectric conversion portion 110 includes an n-type semiconductor region 111, an n-type semiconductor region 112, a p-type semiconductor region 113, and a p-type semiconductor region 114. The photoelectric conversion portion 108 includes the same elements. The semiconductor region 113, the semiconductor region 111, the semiconductor region 112, and the semiconductor region 114 are stacked in that order from the side of the front surface 101 toward the side of the back surface 102 of the semiconductor substrate 10. The semiconductor region 111 has a higher impurity concentration than the semiconductor region 112, whereby electrons obtained through photoelectric conversion in the semiconductor region 112 are efficiently collected and stored in the semiconductor region 111 and are transferred from the transfer gate 115. The semiconductor region 113 and the semiconductor region 111 form a p-n junction therebetween. The semiconductor region 114 and the semiconductor region 112 form a p-n junction therebetween. The n-type semiconductor region 111 is in direct contact with a semiconductor region 130, whereby another p-n junction is provided. Alternatively, the p-n junction between the semiconductor region 111 and the semiconductor region 130 may be provided with a p-type or n-type semiconductor region interposed between the two. As another exemplary configuration of the photoelectric conversion portion 110, the semiconductor region 112 provided at a deeper level of the semiconductor substrate 10 than the semiconductor region 111 may be a p-type semiconductor region having a lower p-type-impurity concentration than the semiconductor region 130.

The semiconductor region 130, which is of the p type, is provided on one side of the semiconductor region 111 and the semiconductor region 112. That is, the semiconductor region 130 is provided side by side with each of the semiconductor region 111 and the semiconductor region 112 in the in-plane direction. The semiconductor region 130 can be formed by, for example, epitaxially growing single-crystal silicon in a trench provided in the semiconductor substrate 10. Details of the semiconductor region 130 will be described later. Thus, the p-n junctions are provided between the semiconductor region 111 and the semiconductor region 130 and between the semiconductor region 112 and the semiconductor region 130. The semiconductor region 130 serves as a potential barrier, which suppresses the leakage of electric charge from the semiconductor regions 111 and 112 to the photoelectric conversion portions of other pixels. Furthermore, a depletion layer formed between the semiconductor region 130 and the semiconductor regions 111 and 112 allows such electric charge to be transferred efficiently. The semiconductor region 130 is electrically continuous with at least one of the semiconductor region 113 and the semiconductor region 114 and is made to have substantially the same potential as the semiconductor region 113 and/or the semiconductor region 114.

The semiconductor substrate 10 carries insulating members 230. The insulating members 230 are each made of, for example, silicon oxide. A bottom surface 233 of the insulating member 230 lies at a deeper level than (on the side of the back surface 102 with respect to) the front surface 101 of the semiconductor substrate 10.

The insulating member 230 is typically an insulating member for isolating the pixel transistor 120 from peripheral elements. The insulating member 230 is not limited to be used for element isolation and may be used as a partition that electrically and/or optically isolates photoelectric conversion portions of different pixels from each other.

The insulating member 230 typically has a trench-isolation structure such as a shallow-trench-isolation (STI) structure or a fully recessed local-oxidation-of-silicon (LOCOS) structure. Even in a case where the insulating member 230 has a semi-recessed LOCOS structure that is not a trench isolation structure, the bottom surface 233 of the insulating member 230 lies at a deeper level than (on the side of the back surface 102 with respect to) the front surface 101 of the semiconductor substrate 10. Note that it is difficult to reduce the size of the semi-recessed LOCOS structure because such a structure has a wide bird's beak.

The semiconductor region 130 is positioned between the semiconductor region 111 and the insulating member 230 in the X direction and/or Y direction corresponding to the in-plane direction that is perpendicular to the Z direction corresponding to the depth direction of the semiconductor substrate 10. In other words, the semiconductor region 111, the semiconductor region 130, and the insulating member 230 are positioned side by side in that order at a shallower level than the bottom surface 233 of the insulating member 230. Such an arrangement reduces the probability that electric charge generated in the interface between the insulating member 230 and any semiconductor region (for example, the semiconductor region 130) may be taken into the semiconductor region 111 and generate some noise. Accordingly, the S/N ratio of the photoelectric conversion apparatus 1 is improved. The concentration of p-type impurities in the semiconductor region 130 can be set to, for example, $1 \times 10^{17}$ to $1 \times 10^{19}$ atoms/cm$^3$. Increasing the impurity concentration of the semiconductor region 130 raises the level of the potential barrier and is therefore beneficial in suppressing the noise attributed to the electric charge generated at the interface between the insulating member 230 and the semiconductor region.

The semiconductor region 130 and the semiconductor region 111 are both present at a deeper level than the bottom surface 233 of the insulating member 230. The semiconductor region 112 and the semiconductor region 130 are present at a deeper level than the semiconductor region 111. Specifically, the semiconductor region 112 and the semiconductor region 130 are positioned side by side in the in-plane direction. Such an arrangement of the semiconductor regions 111 and 112 and the semiconductor region 130 allows signal charge generated at a deep level of the semiconductor substrate 10 to be taken into the semiconductor regions 111 and 112 and thus improves the sensitivity of the photoelectric conversion apparatus 1. Consequently, the S/N ratio of the photoelectric conversion apparatus 1 is improved.

A part of the insulating member 230 overlaps the semiconductor region 130. Specifically, the semiconductor region 130 is present under the insulating member 230. Such an arrangement is beneficial in improving the sensitivity because the isolation characteristic of the semiconductor region 130 is enhanced while the width of the semiconductor region 130 that is positioned between the semiconductor region 111 and the insulating member 230 is reduced. Consequently, the S/N ratio of the photoelectric conversion apparatus 1 is improved.

The pixel transistor 120 is a metal-oxide-semiconductor (MOS) transistor and includes a semiconductor region 121 serving as a well or a body, a channel region 122, a gate insulating film 123, and a gate including a gate electrode 124. The gate is positioned between a source and a drain in the Y direction. The channel region 122 is a region that is present between the source and the drain. When the gate is turned on, a channel is provided in the channel region 122. The channel region 122 is positioned between portions of the insulating member 230 in the X direction. The periphery of the gate electrode 124 is positioned on the insulating member 230. A central portion on the inner side of the periphery of the gate electrode 124 is positioned above the semiconductor region 121 and the channel region 122 each having a lower impurity concentration than the semiconductor region 130.

In such a configuration, the width of the channel region 122 is determined by the insulating member 230. Therefore, the range of variations in the characteristics of the pixel transistors 120 is narrowed. A part of the gate electrode 124 is positioned above the insulating member 230. The presence of the insulating member 230 reduces the probability that a parasitic channel may be produced when the gate is turned on. Hence, the S/N ratio of the photoelectric conversion apparatus 1 is improved.

If the element isolation structure includes only a p-type semiconductor region in replacement of the insulating member 230, temperature variations during a heating step performed in the manufacturing process or the potential applied to the gate electrode 124 may produce variations in the width of the channel, leading to variations in the characteristics of the pixel transistor 120. In particular, variations in the characteristics of the amplifier transistor 118 may generate noise of a fixed pattern. Hence, the range of such variations needs to be narrowed. Therefore, isolating the pixel transistor 120 from peripheral elements by using the insulating member 230 is beneficial in narrowing the range of variations in the characteristics of relevant elements. Accordingly, the S/N ratio of the photoelectric conversion apparatus 1 is improved.

The gate electrode of the transfer gate 109 (115) may not necessarily be provided on the insulating member 230. The transfer gate 109 only needs to be capable of transferring electric charge, because the transfer gate 109 allows a wider range of variations in the width of the channel than the pixel transistor 120. If the insulating member 230 is near the channel region of the transfer gate 109, noise is generated by electric charge generated at the interface between the insulating member 230 and a relevant semiconductor region. In the present embodiment, the gate electrode of the transfer gate 109 overlaps the semiconductor region 130 without overlapping the insulating member 230.

The peripheral circuit region 200 is provided with a p-type peripheral transistor 210 and an n-type peripheral transistor 220. The peripheral transistor 210 and the peripheral transistor 220 are each a MOS transistor and can each form a CMOS circuit. The peripheral transistor 220 includes a semiconductor region 221 serving as a p-type well, a channel region 222, a gate insulating film 223, and a gate electrode 224. The peripheral circuit region 200 is also provided with an element-isolation insulating member 230.

Referring to FIGS. 3A to 5B, a method of manufacturing the photoelectric conversion apparatus 1 will now be described.

FIGS. 3A to 3C illustrate process I of epitaxially growing p-type semiconductor regions 130 in trenches 131 provided in a semiconductor substrate 10. Process I includes steps a to c.

In step a illustrated in FIG. 3A, a semiconductor substrate 10 having trenches 131 is prepared. The semiconductor substrate 10 includes n-type semiconductor regions 135 and n-type semiconductor regions 136. The semiconductor regions 135 are each adjacent to a corresponding one of the trenches 131 and each eventually form a photoelectric conversion portion 110. The semiconductor regions 136 are each adjacent to a corresponding one of the trenches 131 and each eventually form a pixel transistor 120. The semiconductor substrate 10 further includes a semiconductor region 134 at a deeper level than the trenches 131. The bottom surfaces of the trenches 131 are provided by the semiconductor region 134. The sidewalls of the trenches 131 are provided by the semiconductor regions 135 and 136. That is, the semiconductor regions 135 and 136 form sidewalls of the trenches 131.

The semiconductor substrate 10 having the trenches 131 can be formed as follows. First, a substrate including a single-crystal-silicon layer is prepared. The substrate including a single-crystal-silicon layer may be a cut slice of a silicon ingot or a silicon wafer carrying an epitaxially grown single-crystal-silicon layer. The semiconductor substrate 10 may be a silicon-on-insulator (SOI) substrate. The single-crystal-silicon layer is of the n type, for example, and includes n-type semiconductor regions 134, 135, and 136.

A mask having a certain pattern that covers the semiconductor regions 135 and 136 is formed on the single-crystal-silicon layer, and the single-crystal-silicon layer is etched through the mask. In this etching step, an n-type semiconductor region that is present between each of the semiconductor regions 135 and a corresponding one of the semiconductor regions 136 that is adjacent thereto is etched off, whereby trenches 131 are provided. The sidewalls of the trenches 131 are provided by the n-type semiconductor regions 135 and 136. The bottom surfaces of the trenches 131 are provided by the n-type semiconductor region 134. The trenches 131 can be provided by, for example, plasma etching performed with chlorinated etching gas or brominated etching gas. Chlorinated etching gas refers to a gas containing at least one of chlorine and a chlorine compound. Brominated etching gas refers to a gas containing at least one of bromine and a bromine compound.

In step b illustrated in FIG. 3B, a p-type semiconductor material 132 is provided in the trenches 131. Single-crystal silicon is suitable for the semiconductor material 132. Alternatively, amorphous silicon or polysilicon may be employed as the semiconductor material 132. If single-crystal silicon is employed as the semiconductor material 132, the semiconductor substrate 10 is put into an epitaxial-growth apparatus and the semiconductor material 132 is epitaxially grown on the semiconductor substrate 10. Before performing the epitaxial-growth step, the semiconductor substrate 10 having the trenches 131 is cleaned, whereby impurities and natural oxide films are removed. Then, the semiconductor material 132 doped with p-type impurities is epitaxially grown on the semiconductor substrate 10 into single-crystal silicon. Exemplary impurities doped into the semiconductor material 132 include boron. The impurity concentration of the semiconductor material 132 is, for example, $1 \times 10^{17}$ to $1 \times 10^{19}$ atoms/cm$^3$. In the present embodiment, the impurity concentration of the semiconductor material 132 is $1 \times 10^{18}$ atoms/cm$^3$. Increasing the impurity concentration of the semiconductor material 132 that is to form the semiconductor regions 130 enhances the effect of preventing the leakage of electrons, obtained through photoelectric conversion, between different photoelectric conversion portions 110 that are adjacent to each other. However, if the impurity concentration of the semiconductor regions 130 is too high, crystal defects may occur in the epitaxial-growth step, leading to defective formation of the semiconductor regions 130 in the trenches 131. The trenches 131 can each have, for example, an approximate width of 0.3 μm to 3 μm at the front surface 101 of the semiconductor substrate 10 and an approximate depth of 1 μm to 10 μm. The trench 131 may have a depth greater than the width thereof. Preferably, the depth of the trench 131 is twice the width of the trench 131 or greater. More preferably, the depth of the trench 131 is 3 μm or greater. A trench 131 of such a size can be favorably filled with single-crystal silicon that is epitaxially grown therein. In the present embodiment, the trench 131 has a width of 1 μm and a depth of 3 μm.

In the step of providing the semiconductor material 132, the n-type semiconductor regions 135 and 136 can form the sidewalls of the trenches 131, and the n-type semiconductor region 134 can form the bottom surfaces of the trenches 131. To obtain such a configuration, it is desirable not to ionically implanting p-type impurities into the sidewalls and the bottom surfaces of the trenches 131 before the semiconductor material 132 is provided into the trenches 131. Note that, after the p-type semiconductor material 132 is provided into the trenches 131, the p-type impurities in the semiconductor material 132 may be diffused into the semiconductor regions 135 and 136.

The semiconductor material 132 can be epitaxially grown at a temperature of 800° C. to 1000° C. In the present embodiment, the temperature is set to 900° C. If the temperature for epitaxial growth is too low, the productivity is lowered because the growth rate is reduced. If the temperature for epitaxial growth is too high, the impurities in the semiconductor material 132 are more likely to be thermally diffused into the semiconductor regions 135 and 136 adjacent to the trenches 131, reducing the volume of each photoelectric conversion portion 110 and therefore lowering the sensitivity of the photoelectric conversion apparatus 1.

In step c illustrated in FIG. 3C, a portion of the semiconductor material 132 that is on the outside of the trenches 131 is removed. This removal can be performed by chemical mechanical polishing (CMP). Alternatively, the removal may be performed by etchback. Thus, the semiconductor regions 130 are obtained.

Figure 4A:
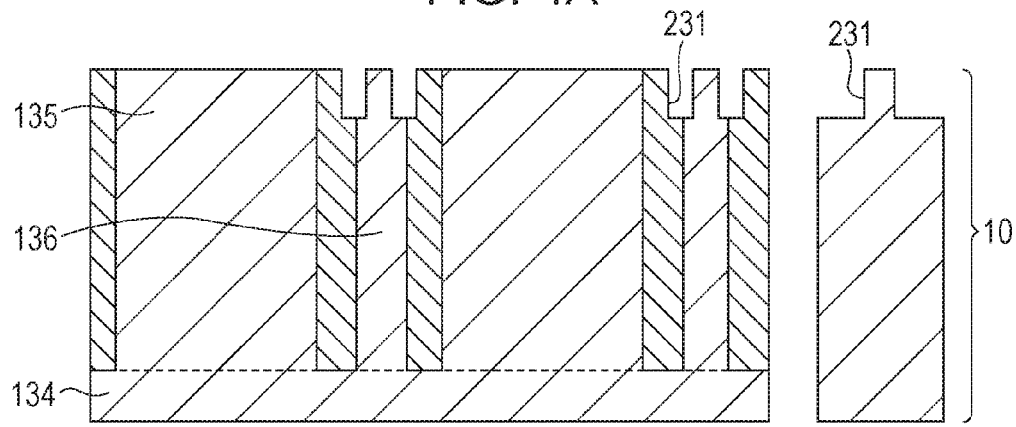
FIGS. 4A to 4C illustrate the exemplary method of manufacturing the photoelectric conversion apparatus in sectional view.
Figure 4B:
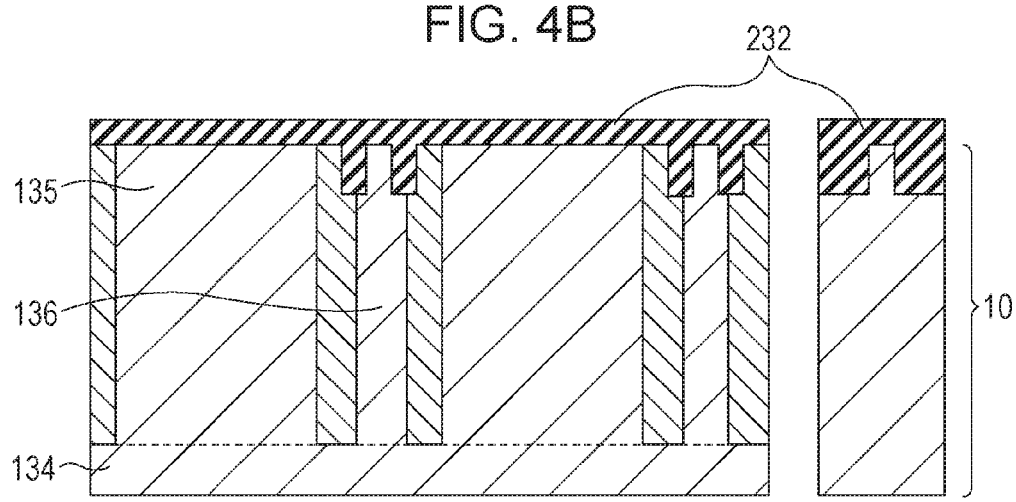
Figure 4C:
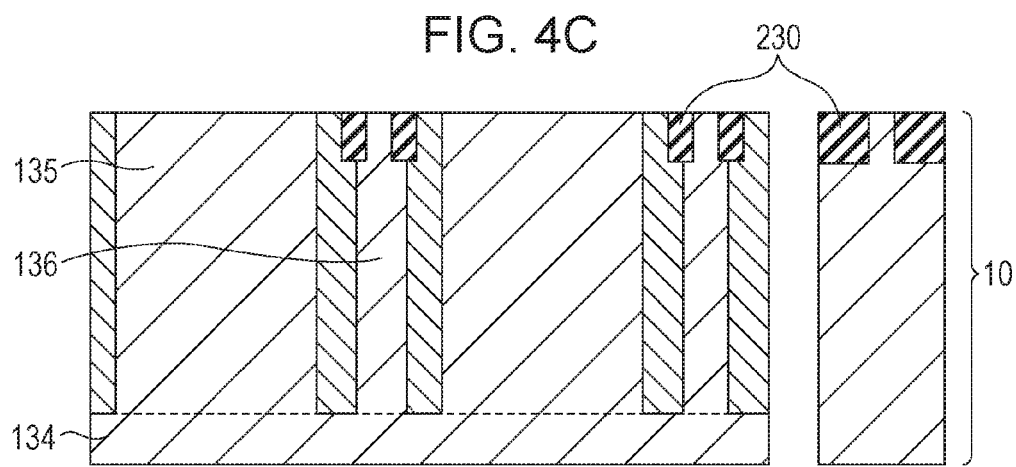

FIGS. 4A to 4C illustrate process II of forming element-isolation insulating members 230 on the semiconductor substrate 10. Process II includes steps d to f.

In step d illustrated in FIG. 4A, trenches 231 are provided in the surface of the semiconductor substrate 10 now having the semiconductor regions 130. The trenches 231 are each a recess provided by removing at least one of the semiconductor region 130 and the semiconductor region 136 of the semiconductor substrate 10. In the present embodiment, each trench 231 is provided by removing a part of the semiconductor region 130 and a part of the semiconductor region 136. Hence, a part of the sidewall of the trench 231 is provided by the semiconductor region 130, and the other part of the sidewall of the trench 231 is provided by the semiconductor region 136. Furthermore, a part of the trench 231 overlaps the semiconductor region 130. Therefore, the semiconductor region 130 remains between the semiconductor region 135, which is to form a photoelectric conversion portion 110, and the trench 231. The position at the bottom of the trench 231 corresponds to the position of the bottom surface 233 of the insulating member 230. The depth of the trench 231 is smaller than the depth of the trench 131. The depth of the trench 231 is, for example, 50 nm to 500 nm. In the present embodiment, the depth of the trench 231 is 300 nm. The width of the trench 231 is 50 nm to 500 nm. In the present embodiment, the width of the trench 231 is 200 nm. The trench 231 having such a size can be easily filled with an insulating material 232.

The trench 231 can alternatively be provided by removing only the semiconductor region 136 but the semiconductor region 130. In that case also, the semiconductor region 130 remains between the semiconductor region 135 and the trench 231. However, the distance between the semiconductor region 135 and the trench 231 is determined by the width of the semiconductor region 130, i.e., the width of the trench 131, making the size reduction of the photoelectric conversion apparatus 1 difficult. Hence, in the present embodiment, a part of the semiconductor region 130 is removed when the trench 231 is provided.

In step e illustrated in FIG. 4B, the trenches 231 are filled with the insulating material 232. The insulating material 232 can be provided by chemical vapor deposition (CVD). The insulating material 232 is, for example, silicon oxide film. Before the insulating material 232 is provided, processes such as cleaning of the semiconductor substrate 10 and thermal oxidation of the inner walls of the trenches 231 may be performed, if necessary. A silicon oxide film as a resultant of thermal oxidation forms a part of the insulating material 232. A part of each of the semiconductor regions 130 is exposed as a part of the sidewall of a corresponding one of the trenches 231. Hence, the insulating material 232 is in contact with the semiconductor regions 130.

In step f illustrated in FIG. 4C, a portion of the insulating material 232 that is on the outside of the trenches 231 is removed. This removal can be performed by CMP or etchback. Thus, the element-isolation insulating members 230 are obtained. The insulating members 230 each formed of a portion of the insulating material 232 is in contact with a corresponding one of the semiconductor regions 130.

As in processes I and II, the insulating members 230 can be formed after the semiconductor regions 130 are formed. In a case where the insulating members 230 are formed before the semiconductor regions 130 are formed, the insulating members 230 are present on the surface of the semiconductor substrate 10 before the semiconductor material 132 is provided into the trenches 131. In such a case, the allowable area for the epitaxial growth of the semiconductor material 132 is limited. Moreover, for example, if a cleaning solution containing hydrofluoric acid is used for the cleaning of the inner walls of the trenches 131, the insulating members 230 are etched off. To avoid such a situation, the insulating members 230 are formed after the semiconductor regions 130 are formed. Thus, the semiconductor substrate 10 including only semiconductor regions can be obtained before the trenches 231 are filled with the insulating material 232. In such a method, the number of restrictions imposed by the cleaning conditions is reduced, and substances such as metal impurities adhered to the semiconductor substrate 10 in forming the trenches 131 can be removed more effectively. Consequently, noise generated by such metal impurities is reduced.

In a known method of forming an insulating member having an STI structure, a p-type semiconductor region for element isolation is formed by ionically implanting p-type impurities obliquely into the semiconductor substrate from the sidewall of a trench before the trench is filled with an insulating material. However, it is not easy to uniformly dope high-concentration impurities into the sidewall of the trench. Hence, electric charge as a cause for the noise that is generated at the interface between the insulating member and the semiconductor region cannot be isolated from the photoelectric conversion portion satisfactorily. Particularly, as the size of the trench is further reduced and the aspect ratio of the trench (the ratio of the trench width to the trench depth) is further increased, the presence of the trench itself or the presence of a resist mask tends to cause shadowing, making it difficult to dope impurities over the entirety of the sidewall of the trench. To avoid such a situation, the size reduction of the photoelectric conversion apparatus is limited. Moreover, impurities, if ionically implanted, tend to spread in a direction apart from the trench in the semiconductor substrate. Therefore, the volume of the photoelectric conversion portion is limited by the width of the insulating member provided in the trench or by the width of the p-type semiconductor region that is formed by ion implantation. Consequently, the improvement of sensitivity is limited. That is, the known isolation structure including the insulating member and the photoelectric conversion portion can only achieve limited improvement of the S/N ratio.

According to the present embodiment, the concentration of impurities in the semiconductor regions 130 is controllable when the semiconductor material 132 is provided, and the width of the semiconductor regions 130 is controllable when the trenches 131 and 231 are provided. Therefore, the isolation performance of the semiconductor regions 130 can be made higher than in the above case where element-isolation semiconductor regions are formed by ion implantation. Consequently, an improved S/N ratio is obtained.

Figure 5A:
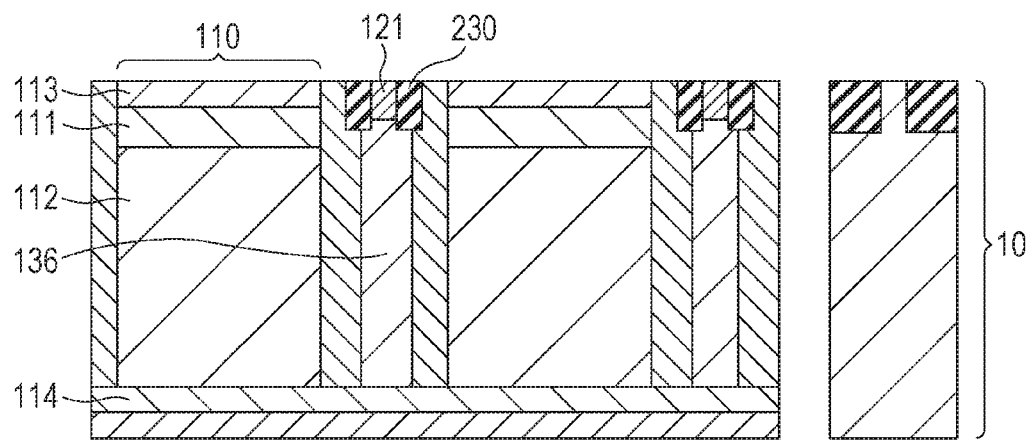
FIGS. 5A and 5B illustrate the exemplary method of manufacturing the photoelectric conversion apparatus in sectional view.
Figure 5B:
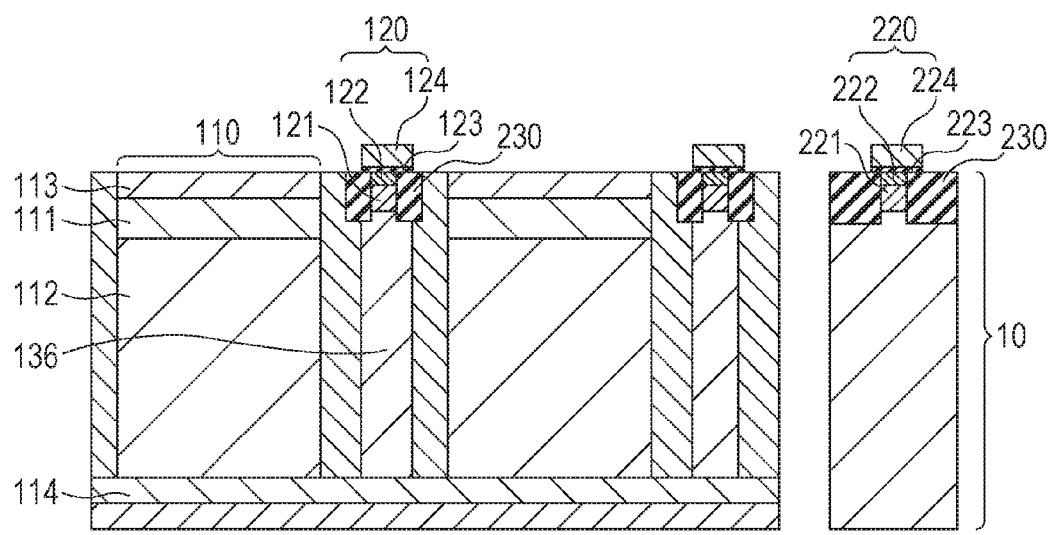

FIGS. 5A and 5B illustrate process III of forming semiconductor devices that are to become the pixel circuits 11. Process III includes steps g and h.

In step g illustrated in FIG. 5A, photodiodes as semiconductor devices that are to become photoelectric conversion portions are formed. Specifically, an n-type semiconductor region 111, an n-type semiconductor region 112, a p-type semiconductor region 113, and a p-type semiconductor region 114 are formed by ion implantation, whereby each photoelectric conversion portion 110 is formed. The n-type semiconductor region 111 is obtained by ion implantation of n-type impurities into the n-type semiconductor region 135. The n-type semiconductor region 112 is obtained as a part of the n-type semiconductor region 135. The p-type semiconductor region 113 is obtained by ion implantation of p-type impurities into the n-type semiconductor region 135. The p-type semiconductor region 114 is obtained by ion implantation of p-type impurities into the n-type semiconductor region 134.

Typically, the semiconductor region 113, the semiconductor region 111, the semiconductor region 112, and the semiconductor region 114 are arranged in that order in the depth direction from the front surface of the semiconductor substrate 10. Although the order of regions to be subjected to ion implantation is basically arbitrary, ion implantation may be started in order from the semiconductor region at the deepest level. The semiconductor region 113 and the semiconductor region 114 are equipotentially in contact with the semiconductor region 130. Thus, a photodiode as a semiconductor device serving as a photoelectric conversion portion 110 is obtained.

The n-type semiconductor region 111 may be formed by providing an n-type single-crystal silicon into a recess provided in the semiconductor substrate 10, as disclosed by Japanese Patent Laid-Open No. 2010-251388.

The semiconductor region 111 is provided such that, at a level shallower than the bottom surface 233 of the insulating member 230, the semiconductor region 130 is present between the n-type semiconductor region 111 and the insulating member 230 and, at a level deeper than the bottom surface 233 of the insulating member 230, the n-type semiconductor region 111 and the p-type semiconductor region 130 are present side by side. The n-type semiconductor region 111 and the p-type semiconductor region 130 form a p-n junction therebetween. Specifically, the n-type semiconductor region 111 is in contact with the sidewall of the trench 131, whereby a p-n junction is provided. Alternatively, the semiconductor region 111 and the semiconductor region 130 may form a p-n junction, with a remaining portion of the semiconductor region 135 interposed therebetween. Alternatively, the semiconductor region 111 and the semiconductor region 130 may form a p-n junction, with a p-type semiconductor region formed by the diffusion of p-type impurities from the semiconductor region 130 into the semiconductor region 135 interposed therebetween.

In step h illustrated in FIG. 5B, pixel transistors 120 as semiconductor devices that are to become reading portions of the pixel circuits 11 are formed. Simultaneously, peripheral transistors 210 and 220 are formed in the peripheral circuit region 200.

First, semiconductor regions 121 and 221 serving as wells and channel regions 122 and 222 are formed by ion implantation in the semiconductor regions 136 of the semiconductor substrate 10 that provide the sidewalls of the trenches 131. Subsequently, gate insulating films 123 and 223 are formed, and gate electrodes 124 and 224 are then formed. Furthermore, source and drain regions are formed. Thus, pixel transistors 120 and peripheral transistors 220 are obtained. In the present embodiment, the semiconductor region 121 and the channel region 122 of each pixel transistor 120 are formed in the semiconductor region 136, not in the trench 131 of the semiconductor substrate 10. Hence, the semiconductor region 121 and the semiconductor region 136 that are present below the channel region 122 are sandwiched by the semiconductor region 130.

At least a part of each of the gate electrodes 124 and 224 is provided on the channel region 122 or 222 with the gate insulating film 123 or 223 interposed therebetween. In the present embodiment, a part (the periphery) of each of the gate electrodes 124 and 224 is positioned above the insulating member 230, and the width of each of the channel regions 122 and 222 is determined by the distance between opposite positions at the periphery of the insulating member 230 in the in-plane direction. In the pixel transistor 120 and the peripheral transistor 220 having such configurations, the width of each of the channel regions 122 and 222 can be determined regardless of factors such as the thermal treatment performed in the manufacturing process and the potential applied to the gate electrode 124 or 224. Hence, the range of variations in the characteristics of each of the pixel transistor 120 and the peripheral transistor 220 is narrowed. The gate electrodes of the transfer gates 109 and 115 illustrated in FIG. 2A are provided in such a manner as not to overlap the insulating members 230.

Figure 6A:
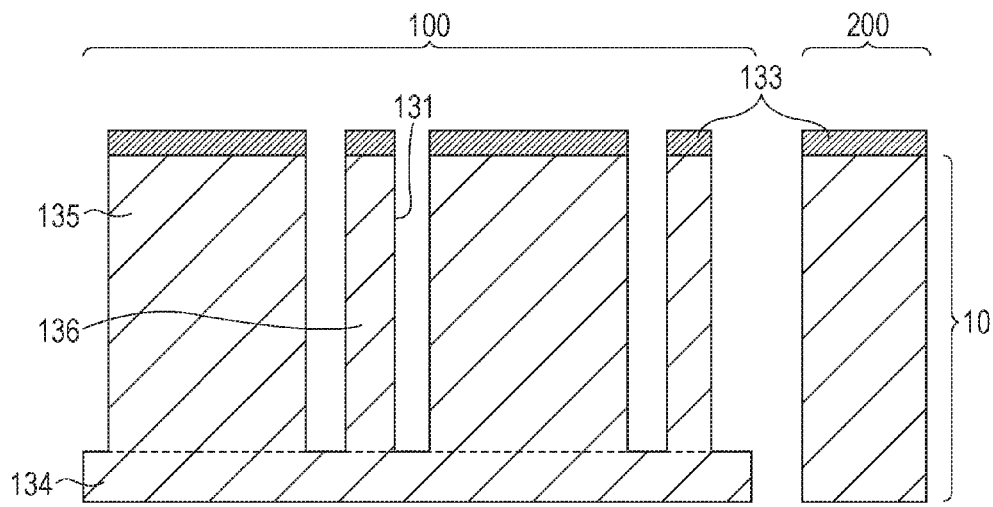
FIGS. 6A to 6C illustrate another exemplary method of manufacturing the photoelectric conversion apparatus in sectional view.
Figure 6B:
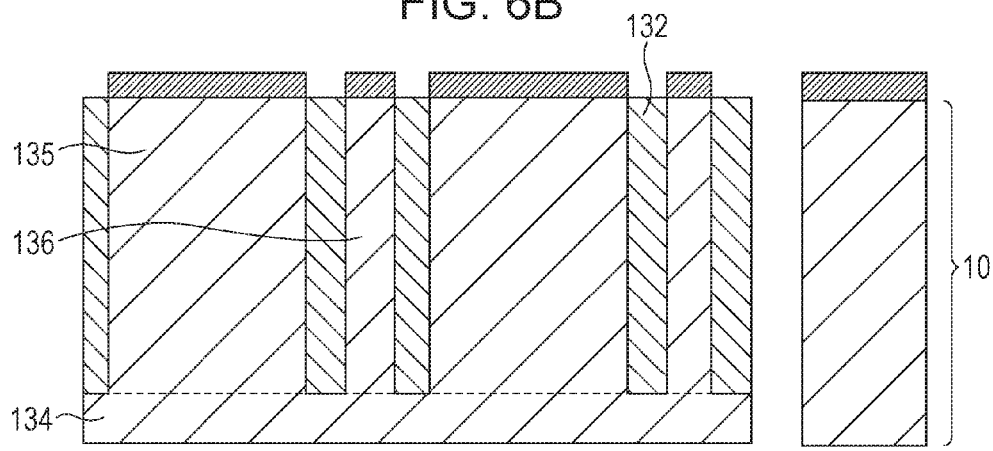
Figure 6C:
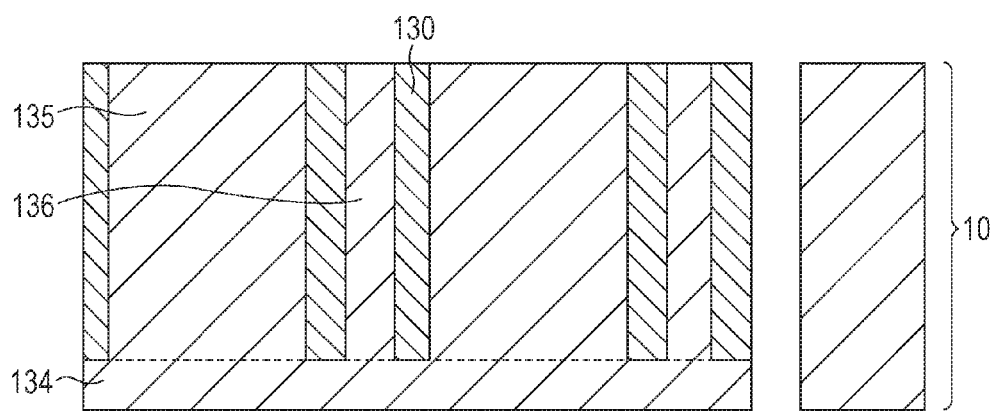

FIGS. 6A to 6C illustrate another method of forming semiconductor regions 130. In this method, a non-semiconductor film is formed on the semiconductor substrate 10 and is patterned. The non-semiconductor film is, for example, an insulating film such as a silicon oxide film or a silicon nitride film. As illustrated in FIG. 6A, trenches 131 are provided by using, as a mask, a non-semiconductor layer 133 (an insulating layer) formed of the non-semiconductor film (an insulating film). Subsequently, as illustrated in FIG. 6B, a semiconductor material 132 is epitaxially grown, with the non-semiconductor layer 133 staying on the semiconductor substrate 10. In this state, the non-semiconductor layer 133 covers the surfaces of the semiconductor regions 135 and 136 of the semiconductor substrate 10 that are on the outside of the trenches 131. In general, a semiconductor material does not epitaxially grow on a non-semiconductor layer. Therefore, the semiconductor material 132 is selectively grown in the trenches 131. Thus, even if the trenches 131 each have a smaller size than those illustrated in FIG. 3B, such trenches 131 can be filled with the semiconductor material 132. The trenches 131 provided by the method illustrated in FIGS. 6A to 6C each have a width of, for example, 0.3 μm. After the semiconductor material 132 is provided, the non-semiconductor layer 133 is removed as illustrated in FIG. 6C. If the resulting front surface 101 has any irregularities, the front surface 101 of the semiconductor substrate 10 may be planarized, according to need, after the non-semiconductor layer 133 is removed.

Figure 7A:
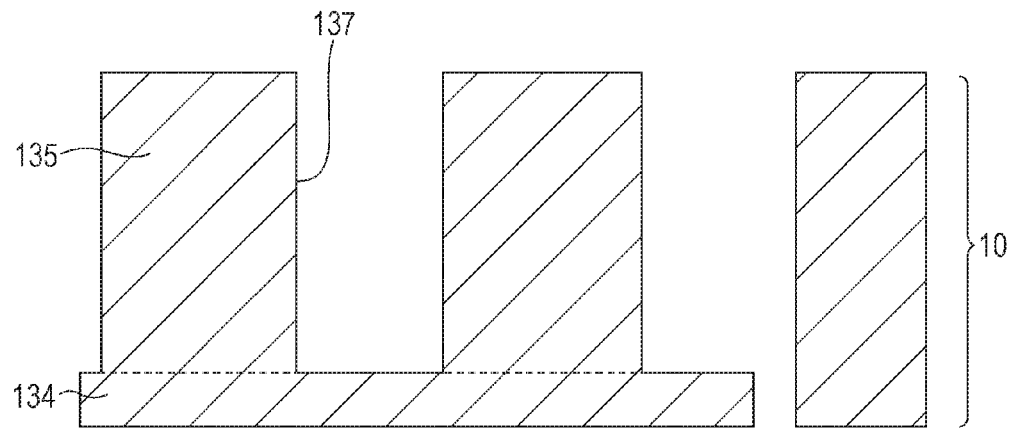
FIGS. 7A to 7C illustrate yet another exemplary method of manufacturing the photoelectric conversion apparatus in sectional view.
Figure 7B:
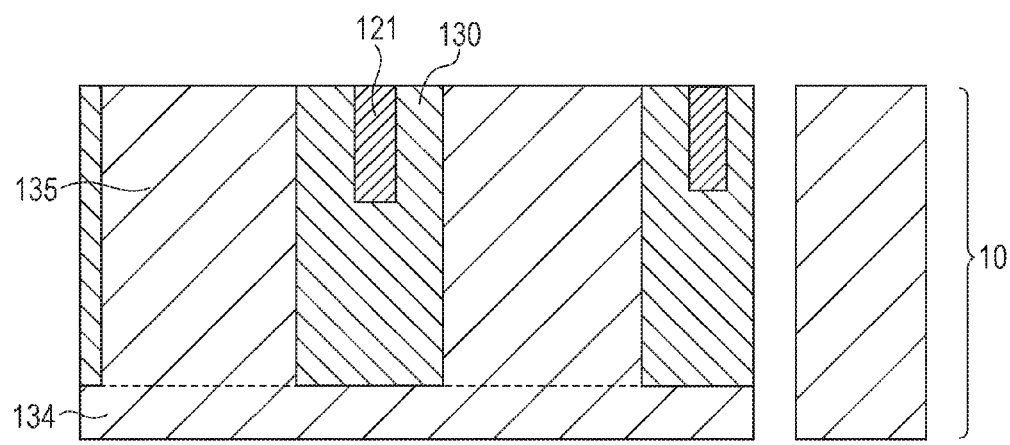
Figure 7C:
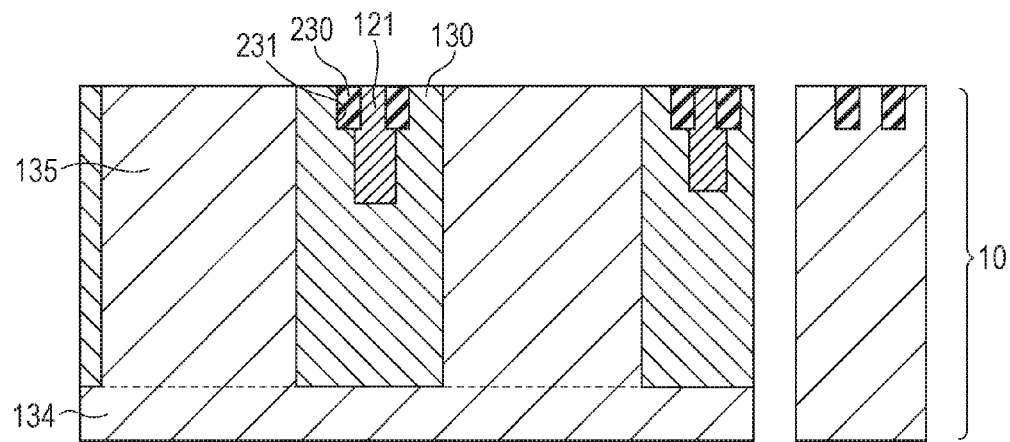

FIGS. 7A to 7C illustrate yet another method of forming the semiconductor regions 130. In this method, not only the semiconductor region 130 but also the semiconductor region 121 serving as a well and the channel region 122 are epitaxially grown in each trench 137.

In step i illustrated in FIG. 7A, trenches 137 are provided in respective regions each containing a region that is to become a pixel transistor 120. That is, the trenches 137 are provided by removing the semiconductor regions 136, illustrated in FIG. 3A, as well.

In step j illustrated in FIG. 7B, a p-type semiconductor material that is to become the p-type semiconductor regions 130 is grown in the trenches 137 in an epitaxial-growth apparatus. Before completely filling the trenches 137 with the semiconductor material, the p-type impurities doped in the semiconductor material to be grown is changed to n-type impurities, whereby an n-type semiconductor material that is to become the semiconductor regions 121 is grown in the trenches 137. Thus, a semiconductor substrate 10 having the p-type semiconductor regions 130 and the n-type semiconductor regions 121 in the trenches 137 is obtained.

Subsequently, in step k illustrated in FIG. 7C, trenches 231 are provided, and insulating members 230 are formed in the trenches 231. The trenches 231 are each provided by removing at least one of the semiconductor region 130 and the semiconductor region 121. The semiconductor region 130 is present between the semiconductor region 135, which is to become the photoelectric conversion portion 110, and the trench 231. If the trench 231 is provided in such a manner, the semiconductor region 130 can be provided between the insulating member 230 and the photoelectric conversion portion 110. In this method, since both the semiconductor region 130 and the semiconductor region 121 are removed, the size of the photoelectric conversion apparatus 1 can be reduced.

While the above method concerns a case where the semiconductor region 121 is grown epitaxially, the n-type semiconductor region 121 can alternatively be formed by filling the trench 137 with a p-type semiconductor material and then ionically implanting n-type impurities into a part of the p-type semiconductor material.

The above embodiments can be modified appropriately without departing from the scope of the present technique.

According to the above embodiment, a photoelectric conversion apparatus having a favorable S/N ratio and a method of manufacturing the same can be provided.

While the disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-239716, filed Dec. 8, 2015, which is hereby incorporated by reference herein in its entirety.

What is claimed is:

1. A method of manufacturing a photoelectric conversion apparatus comprising:
   forming a first semiconductor region of a first conductivity type in a trench provided in a semiconductor substrate;
   forming an insulating member on the semiconductor substrate;
   forming a second semiconductor region of a second conductivity type that forms a photoelectric conversion portion; and
   forming a gate electrode of a transistor on the semiconductor substrate,
   wherein the first semiconductor region is present between the second semiconductor region and the insulating member in a direction perpendicular to a depth direction of the semiconductor substrate, and
   wherein a first part of the gate electrode is positioned above a channel region of the transistor, and a second part of the gate electrode is positioned above the insulating member.

2. The method according to claim 1, wherein the first semiconductor region and the second semiconductor region are present at a deeper level of the semiconductor substrate than a bottom surface of the insulating member, and the first semiconductor region is present at a deeper level of the semiconductor substrate than the second semiconductor region.

3. The method according to claim 1, further comprising:
forming a third semiconductor region having a lower impurity concentration than the first semiconductor region and being of the first conductivity type,
wherein the third semiconductor region is present at a deeper level of the semiconductor substrate than the second semiconductor region, and
wherein the second semiconductor region and the third semiconductor region are present side by side in the direction perpendicular to the depth direction of the semiconductor substrate.

4. The method according to claim 1, wherein the forming of the first semiconductor region includes providing a semiconductor material that forms the first semiconductor region into the trench, with a sidewall of the trench being provided by the second semiconductor region of the second conductivity type.

5. The method according to claim 1, wherein the insulating member is formed after the first semiconductor region is formed.

6. The method according to claim 1,
wherein the forming of the insulating member includes:
removing a part of the first semiconductor region; and
providing an insulating material that forms the insulating member into a recess provided by the removing of the part of the first semiconductor region.

7. The method according to claim 6, wherein a part of the semiconductor substrate is removed in the removing of the part of the first semiconductor region.

8. The method according to claim 1, wherein the insulating member and the first semiconductor region are in contact with each other, and the second semiconductor region and the first semiconductor region form a p-n junction in between.

9. The method according to claim 1, wherein the second semiconductor region of the second conductivity type sandwiched by the first semiconductor region is present below the insulating member.

10. The method according to claim 1, wherein a semiconductor region providing a sidewall of the trench provided in the semiconductor substrate is present below the channel region.

11. The method according to claim 1, further comprising:
forming, on the semiconductor substrate, a gate electrode of a transfer gate that transfers electric charge generated in the photoelectric conversion portion,
wherein the gate electrode of the transfer gate overlaps the second semiconductor region without overlapping the insulating member.

12. The method according to claim 1, wherein the first semiconductor region is formed by epitaxial growth.

13. The method according to claim 12, wherein, in the forming of the first semiconductor region, a region of the semiconductor substrate that is on an outside of the trench is covered with an insulating layer.

14. The method according to claim 1, wherein the trench has a depth of 3 µm or greater.

15. A photoelectric conversion apparatus comprising:
a semiconductor substrate having a trench;
a first semiconductor region of a first conductivity type that is provided in the trench;
a second semiconductor region of a second conductivity type that serves as a photoelectric conversion portion; and
an insulating member provided on the semiconductor substrate,
wherein the first semiconductor region is present between the second semiconductor region and the insulating member in a direction perpendicular to a depth direction of the semiconductor substrate,
wherein a gate electrode of a transistor is provided on the semiconductor substrate, and
wherein a first part of the gate electrode is positioned above a channel region of the transistor, and a second part of the gate electrode that is different from the first part is positioned above the insulating member.

16. The photoelectric conversion apparatus according to claim 15, wherein the first semiconductor region and the second semiconductor region are present at a deeper level of the semiconductor substrate than a bottom surface of the insulating member, and the first semiconductor region is present at a deeper level of the semiconductor substrate than the second semiconductor region.

17. The photoelectric conversion apparatus according to claim 15, further comprising:
a third semiconductor region having a lower impurity concentration than the first semiconductor region and being of the first conductivity type,
wherein the third semiconductor region is present at a deeper level of the semiconductor substrate than the second semiconductor region, and
wherein the second semiconductor region and the third semiconductor region are present side by side in the direction perpendicular to the depth direction of the semiconductor substrate.

18. The photoelectric conversion apparatus according to claim 15, wherein the transistor is an amplifier transistor.

19. The photoelectric conversion apparatus according to claim 15, further comprising:
a gate electrode of a transfer gate, the gate electrode being provided on the semiconductor substrate and transferring electric charge generated in the photoelectric conversion portion, and
wherein the gate electrode of the transfer gate overlaps the second semiconductor region without overlapping the insulating member.

20. The photoelectric conversion apparatus according to claim 15, wherein the first semiconductor region is made of single-crystal silicon.

* * * * *